(12) United States Patent
Mimura et al.

(10) Patent No.: US 7,412,683 B2
(45) Date of Patent: Aug. 12, 2008

(54) PRINTED WIRING BOARD DESIGN METHOD, PROGRAM THEREFOR, RECORDING MEDIUM STORING THE PROGRAM RECORDED THEREIN, PRINTED WIRING BOARD DESIGN DEVICE USING THEM AND CAD SYSTEM

(75) Inventors: Shoichi Mimura, Hirakata (JP); Hirotsugu Fusayasu, Uji (JP); Miyoko Irikiin, Amagasaki (JP); Seiji Hamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 175 days.

(21) Appl. No.: 10/555,758

(22) PCT Filed: Feb. 3, 2005

(86) PCT No.: PCT/JP2005/001589

§ 371 (c)(1),
(2), (4) Date: Nov. 7, 2005

(87) PCT Pub. No.: WO2005/076163

PCT Pub. Date: Aug. 18, 2005

(65) Prior Publication Data

US 2006/0242615 A1    Oct. 26, 2006

(30) Foreign Application Priority Data

Feb. 5, 2004    (JP)    ............................ 2004-028840

(51) Int. Cl.
*G06F 17/50*    (2006.01)
(52) U.S. Cl. ...................................................... 716/15
(58) Field of Classification Search ..................... 716/2, 716/4, 8–10, 12–15
See application file for complete search history.

(56) References Cited

U.S. PATENT DOCUMENTS 5,247,455 A * 9/1993 Yoshikawa ................... 716/15

(Continued)

FOREIGN PATENT DOCUMENTS

JP    5-205011    8/1993

(Continued)

OTHER PUBLICATIONS

"*Decoupling Associativity Rules Coding*", IBM Technical Disclosure Bulletin, IBM Corp., New York, US, vol. 38, No. 2, Feb. 1, 1995, p. 397, XP000502517.

(Continued)

*Primary Examiner*—Stacy A Whitmore
(74) *Attorney, Agent, or Firm*—Wenderoth, Lind & Ponack, L.L.P.

(57) ABSTRACT

A printed wiring board design method including the steps of designing placement and wiring for circuit components based on circuit information on a mounting surface of the board; excluding a placement region and a wiring region for the circuit components from the mounting surface to thereby calculate a placement and wiring enable region for an EMC component in which the EMC component can be placed and wiring can be laid down; and calculating the placement and wiring range for the EMC component based on an EMC design rule from the calculated placement and wiring enable region for the EMC component. Thus, a printed wiring board design method is provided in which placement of and wiring for a new bypass capacitor or the like can be implemented and a region satisfying restraint items from the design rule can be clearly displayed as a new input enable region on a CAD screen.

19 Claims, 7 Drawing Sheets

U.S. PATENT DOCUMENTS

| | | | |
|---|---|---|---|
| 5,657,242 | A | 8/1997 | Sekiyama et al. |
| 5,745,371 | A * | 4/1998 | Shouen .................. 716/15 |
| 6,232,154 | B1 | 5/2001 | Reith et al. |
| 6,434,730 | B1 | 8/2002 | Ito et al. |
| 6,477,694 | B1 | 11/2002 | Irino et al. |
| 6,557,154 | B1 * | 4/2003 | Harada et al. ............ 716/11 |
| 6,625,791 | B1 | 9/2003 | Bobba et al. |
| 6,629,302 | B2 * | 9/2003 | Miura et al. .............. 716/8 |
| 6,691,296 | B1 * | 2/2004 | Nakayama et al. ........ 716/15 |
| 6,938,231 | B2 * | 8/2005 | Yoshida et al. ............ 716/5 |
| 7,114,132 | B2 * | 9/2006 | Yaguchi .................. 716/1 |
| 2001/0034875 | A1 * | 10/2001 | Nakayama et al. ........ 716/15 |
| 2002/0157067 | A1 | 10/2002 | Yaguchi |
| 2004/0015804 | A1 * | 1/2004 | Nakayama et al. ........ 716/10 |
| 2004/0064800 | A1 | 4/2004 | Korobkov |
| 2004/0073880 | A1 * | 4/2004 | Yoshida et al. ............ 716/8 |
| 2004/0073881 | A1 | 4/2004 | Nassif et al. |

FOREIGN PATENT DOCUMENTS

| | | |
|---|---|---|
| JP | 2000-67089 | 3/2000 |
| JP | 2001-125943 | 5/2001 |
| JP | 2002-16337 | 1/2002 |
| JP | 2003-6260 | 1/2003 |
| JP | 2003-44541 | 2/2003 |
| JP | 2004-258756 | 9/2004 |

OTHER PUBLICATIONS

Chinese Office Action (in English language) issued Sep. 21. 2007.

* cited by examiner

PRINTED WIRING BOARD DESIGN METHOD, PROGRAM THEREFOR, RECORDING MEDIUM STORING THE PROGRAM RECORDED THEREIN, PRINTED WIRING BOARD DESIGN DEVICE USING THEM AND CAD SYSTEM

BACKGROUND OF THE INVENTION

1. Technical Field

This invention relates to a CAD system for designing a printed wiring board, a printed wiring board design method, a printed wiring board design device, and a method and device for an EMC design, applicable to the CAD system.

2. Description of Related Art

Electronic equipment in recent years has advanced the progress of downsizing, high functionality and digitalization, which has entailed an increase in unnecessary radiation noise exerting an influence on other electronic equipment of an electromagnetic wave radiated by the electronic equipment of interest, which has increasingly enhanced more and more the necessity for a measure to diminish the unnecessary radiation noise. Whereas, since there is a relationship of a trade-off between the measures to be taken and downsizing, EMC design has become technically more and more difficult to cope with every year.

Various noise reduction designs have been studied such as high frequency isolation of IC power supply wiring using an inductance element and a capacitance element on a digital circuit board, which is a source of generation of unnecessary radiation noise and a strip structure of signal wiring.

Especially, since a bypass capacitor inserted between the power supply terminal and the GND terminal of a digital IC not only stabilizes a high frequency variation in a power supply voltage generated in company with a switching operation of the IC by supplementing the variation with an accumulated charge, but also feeds back a high frequency component to the GND terminal of the IC to thereby play a role in confirming high frequency noise in the neighborhood of the IC, the inserted bypass capacitance has been widely known as the most basic and important means in the unnecessary radiation noise reduction for a circuit board, which leads to proposals offered on a printed wiring board design device using many of the schemes and tools concerning placement of a bypass capacitor and wiring.

For example, a proposal on an automatic placement, wiring devices offered in Patent document 1 (JP 05-205011) in which a board is divided into plural wiring regions and not only are densities of existing components and wires leveled over the regions, being made balanced therebetween, but the shortest wiring length is also achieved, and besides, another proposal on an automatic placement scheme is offered in Patent document 2 (JP 2000-67089) in which a projection area of components and wires is minimized.

The design device, however, is extremely insufficient with respect to the unnecessary radiation noise reduction of a circuit board. The reason why is such that, in the actual board design, a necessity arises for considerations to be given to many of design items such as an operating frequency of an IC, a thickness of a wiring layer or a wire and a capacity characteristic of a capacitor in addition to a distance between the IC and the bypass capacitor and a wiring length for reduction of EMC in order to reduce EMC. Therefore, the work becomes indispensable that design data is deliberately examined based on a design rule obtained by organizing the items to be considered, which is difficult and extremely time consuming, having led to a problem of inability in implementing a sufficient EMC design in a limited design time.

Figure 11:
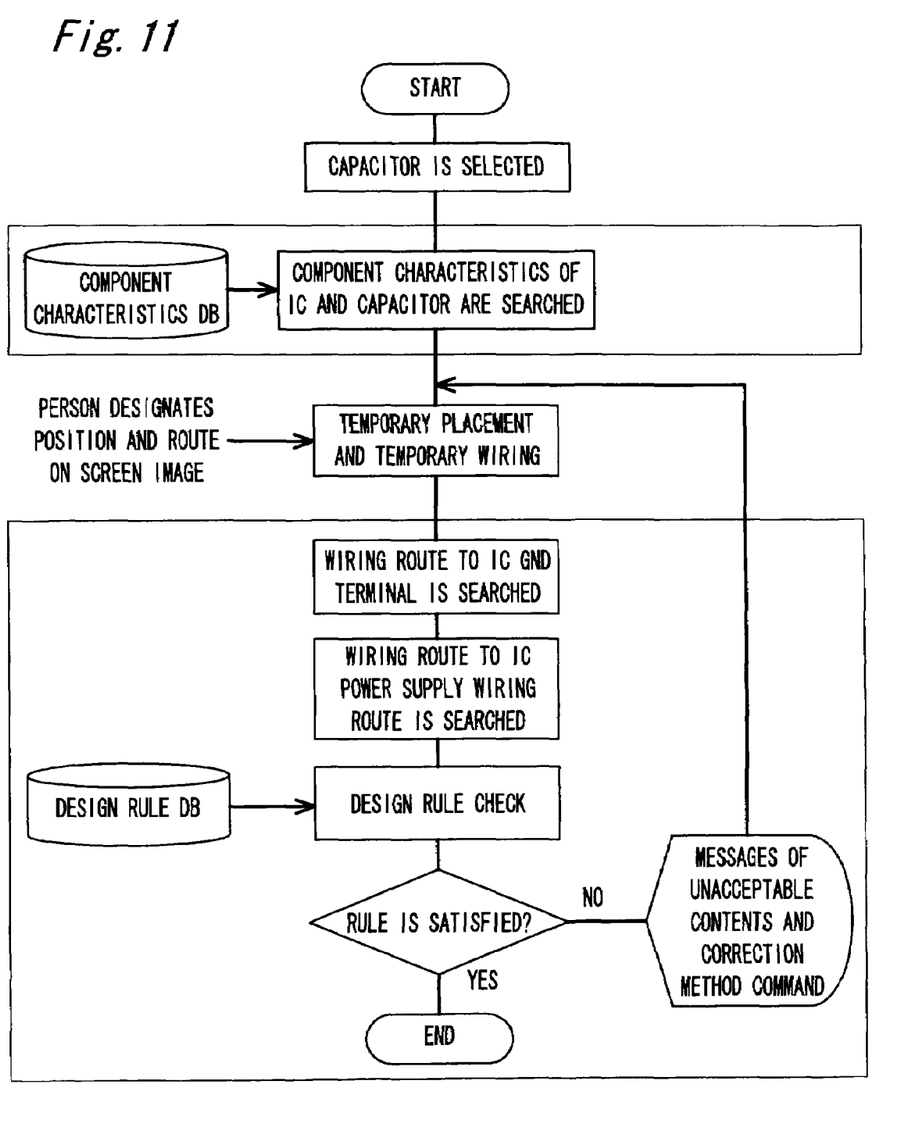
FIG. 11 is a flowchart showing an example conventional method for designing an EMC reduction board pattern.

There has been contrived a method as a measure for improvement on such a problem in which placement and wiring data for a bypass capacitor to be inputted to a CAD system used for a printed wiring board design is checked in real time, and if the data falls outside of the allowable range, a warning message is displayed on a screen so that a designer is urged to improve the design to thereby confine the CAD data within the allowable range defined by the design rule. For example, FIG. 11 is a descriptive diagram showing a design flow on CAD according to the conventional method, wherein a designer compares design data with which placement and wiring are temporarily conducted with a design rule DB and component characteristics DB to thereby perform a pass/fail determination and if the determination is fail, a warning message is displayed on a screen.

| | |
|---|---|
| Patent document 1. | JP-A No. 05-205011 |
| Patent document 2. | JP-A No. 2000-67089 |
| Patent document 3. | JP-A No. 2001-125943 |
| Patent document 4. | JP-A No. 2002-16337 |

SUMMARY OF THE INVENTION

The above-described method, however, has had difficulty, for example, in optimally designing a placement position of a bypass capacitor and a wiring route since determination of the placement position of a bypass capacitor and a wiring route are conducted by a person at random in a range in which a design rule is observed, which causes a problem in that a design quality of EMC is different according to an ability of a pattern designer in circumstances where a reduction level of EMC is different according to a placement position and a wiring route.

That is, since in a conventional method, a placement position of a bypass capacitor or the like and a wiring route is determined by a person at random within a range in which a design rule is observed, a problem has arisen in that EMC design quality is dependent on the pattern designer to thereby produce variations in design quality.

It is, accordingly, an object of the invention to provide a printed wiring board design method, a printed wiring board design device and a CAD system capable of designing a printed wiring board without a quality differential of design caused by a pattern designer.

A printed wiring board design method pertaining to the invention, in order to achieve the object, including the steps of: designing placement of and wiring for circuit components based on circuit information on a mounting surface of the board; excluding a placement region and a wiring region for the circuit components from the mounting surface to thereby calculate a placement and wiring enable region for an EMC component in which the EMC component can be placed and wiring can be laid down; and calculating the placement and wiring range for the EMC component based on an EMC design rule from the calculated placement and wiring enable region for the EMC component.

A printed wiring board design method pertaining to the invention can also include the step of: evaluating placement of and wiring for the EC reduction component in the placement and wiring range based on allowances of design values of the items of the EMC design rule and weights assigned to the items.

According to a printed wiring board design method pertaining to the invention, since a placement and wiring range for an EMC component is calculated based on the EMC design rule, for example, placement of and wiring for a new bypass capacitor or the like can be implemented and a region satisfying restraint items from the design rule can be clearly displayed as a new input enable region on a CAD screen.

Besides, in the printed wiring board design method pertaining the invention, if placement of and wiring for the EMC component in the placement and wiring range is evaluated based on the allowances and the assigned weights, the optimal placement of and wiring for the EMC component can be clearly shown to thereby enable EMC design for a stable printed wiring board so as to realize a design quality that is not dependent on the pattern designer.

According to the invention, therefore, there can be provided a printed wiring board design method, a printed wiring board design device and a CAD system capable of designing a printed wiring board without a quality differential of design caused by the pattern designer.

REFERENCE NUMERALS

1 IC
2-3 Power supply terminal
4-5 GND terminals
6-7 Signal terminals
8-9 Bypass capacitors
10-11 Power supply wire
12 GND wire
13-14 signal wire
15 Via
16-17 Circle with a radius 20 mm having a terminal of IC as a center
18 Overlapping region of circle 16 and circle 17
19 Range 10 mm from IC
20-21 Placement and Wiring enable range
22 Placement limit of the bypass capacitance (placement angle of 90 degrees)
23 Placement limit of the bypass capacitance (placement angle of 0 degrees)
24 Contour line
25-1 Candidate point with the highest evaluation score

DETAILED DESCRIPTION OF THE INVENTION

Figure 1:
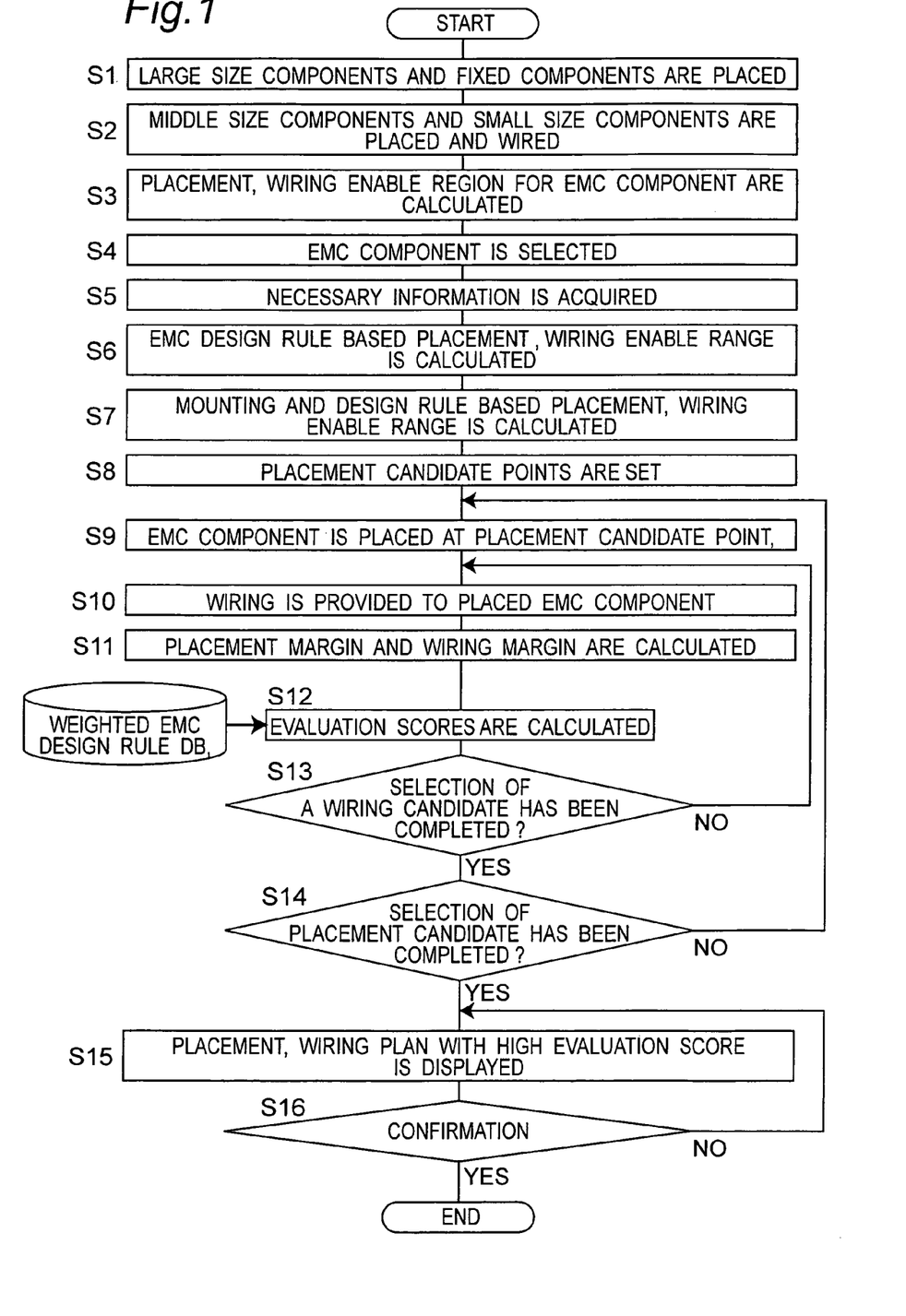
FIG. 1 is a flowchart of a printed wiring board design method of an embodiment pertaining to the invention.

FIG. 1 is a flowchart of a printed wiring board design method of an embodiment pertaining to the invention and the optimal EMC design can be acquired without dependency on a designer by conducting printed wiring board design, following the flowchart.

Description will be given of a printed wiring board design method of the embodiment below based on the flowchart of FIG. 1.

Step S1

In step S1 of the printed wiring board design method of the embodiment, of large scale ICs, middle scale ICs, connectors (terminals) and components of an IC peripheral circuit, which are extracted based on information on circuit components, placement of the large scale ICs and the like (large size components) occupying a comparative large mounting area and the connectors (terminals), which are fixed components and placement positions of which are determined in advance is determined based on information on circuit wiring and terminal placement Step S2

Then, in step S2, placement of the middle scale ICs (middle size components) and the components of an IC peripheral circuit (small size circuit components) are determined to determine a wiring pattern therefor. In step S1 and step S2, combined, there are determined a basic construction constructed of the large scale ICs, the middle scale ICs, the connectors (terminals) and the components of an IC peripheral circuit and a basic pattern.

Step S3

In step 3, a placement and wiring enable region for an EMC component is calculated based on the basic construction and the basic pattern that have been determined in steps S1 and S2. To be more specific, a region excluding a region occupied by the large scale ICs, the middle scale ICs, the connectors (terminals) and the components of an IC peripheral circuit, which have been determined in steps S1 and S2, and a region in which a wiring pattern is formed is calculated as a placement and wiring enable region for an EMC component.

Step S4

In step S4, an EMC component to be added is selected.

Step S5

In step S5, there is acquired circuit information necessary for placement and wiring of an EMC component on a signal frequency, a power supply voltage and others.

Step S6

In Step 6, a range is calculated in which an EMC component can be placed with reference to an EMC design rule.

For example, in a case where an EMC design rule shown in Table 1 exists when a bypass capacitor 9 is inserted between a power supply terminal 3 and a GND terminal 5 of IC1 (see FIG. 2), a circle 16 with a radius 20 mm having the power supply terminal 3 of IC 1 as the center and a circle 17 with a radius 20 mm having the GND terminal 5 of IC1 as the center are overlapped. The overlapping region is calculated as a placement enable region for the bypass capacitor 9 (hereinafter, a design rule based placement enable range; see FIG. 3).

Figure 2:
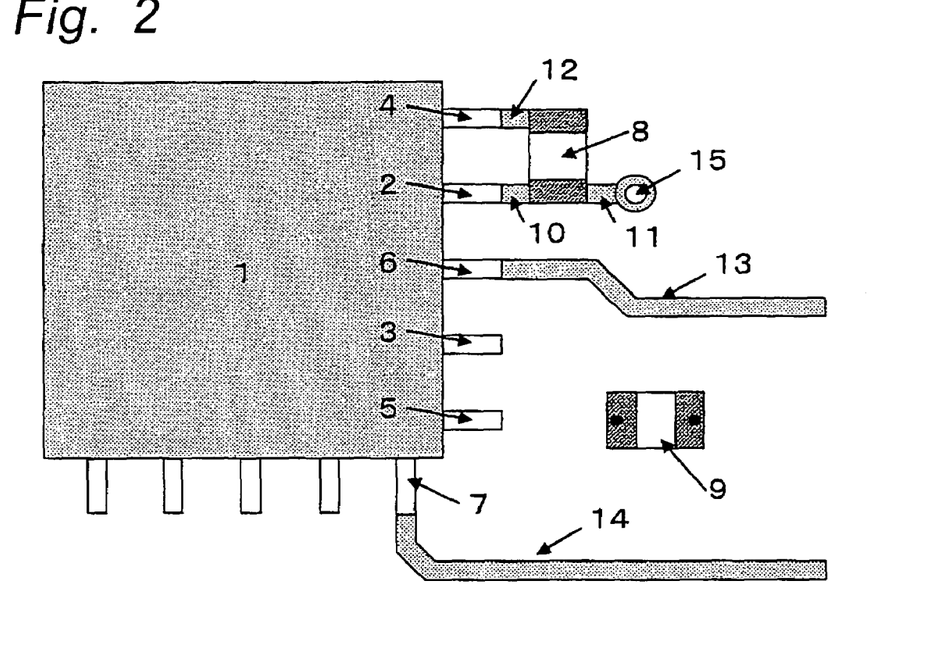
FIG. 2 is a top plan view showing a board pattern prior to placement of an EMC component in the embodiment.
Figure 3:
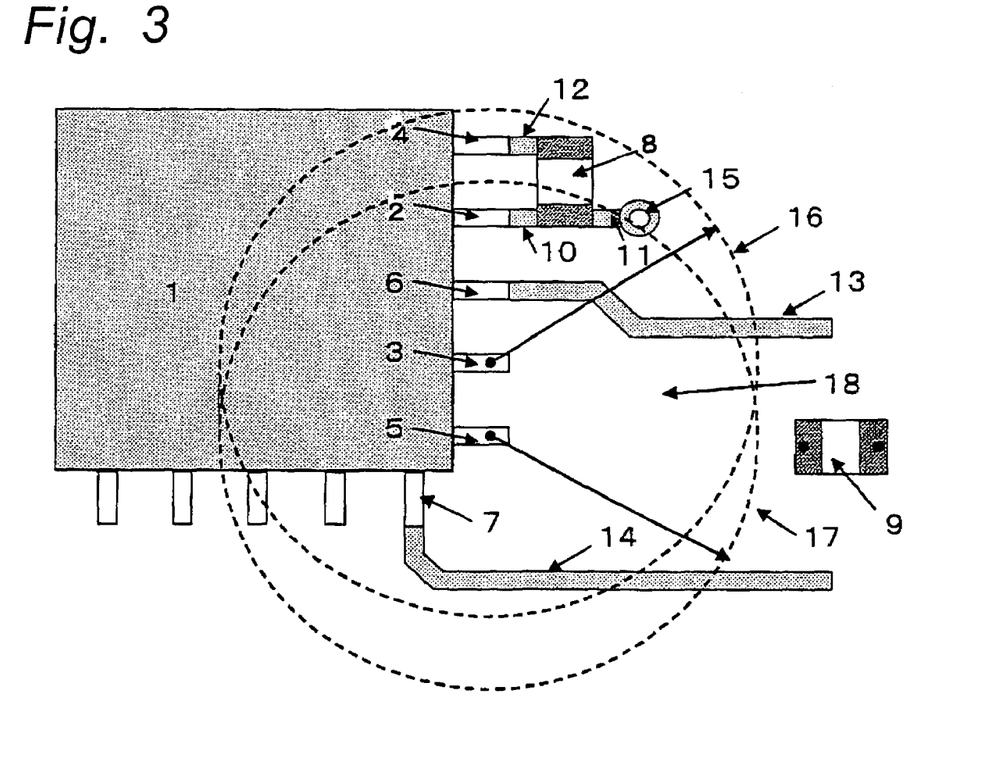
FIG. 3 is a top plan view (1) for describing a process for determining a placement region in the embodiment.

FIG. 2 is a view showing a printed wiring board prior to placement of the bypass capacitor 9 thereon and a reference numeral 1 indicates an IC, 2 and 3 the power supply terminals, 4 and 5 the GND terminals of the IC, 6 and 7 signal terminals of IC1, 8 a bypass capacitor that has already been inserted between the power supply terminal 2 and the GND terminal 4 of IC1, 9 a bypass capacitor that is to be inserted between the power supply terminal 3 and the GND terminal 5 of IC1, 10 and 11 are power supply wires, 12 a GND wire, 13 and 14 signal wires of IC1, and 15 a connection via from the power supply wire 11 to a power supply layer constituting a layer inside the board. Note that wires and components not described above connected to IC1 are omitted for simplicity of description.

TABLE 1

| | Items | | Locations | Restraints |
|---|---|---|---|---|
| 1 | Placement | Distances | Between IC power supply terminal and capacitor | 20 mm or less |
| 2 | | | Between IC GND terminal and capacitor | 20 mm or less |
| 3 | | Power supply via | Between IC and capacitor | Placement disabled |
| 4 | | Capacitor | Related to IC | Placement on the same surface |
| 5 | Wiring | Distances | Between IC power supply terminal and capacitor | 20 mm or less |
| 6 | | | Between IC GND terminal and capacitor | 30 mm or less |
| 7 | | | Between via and capacitor | 10 mm or less |

Step S7

In step S7, a region in which an EMC component cannot be placed because of restraints on mounting or board fabrication is excluded from a design rule based placement and wiring enable range of an EMC component that has been calculated in step S6, to thereby calculate a mounting and design rule based placement and wiring enable range.

Figure 4:
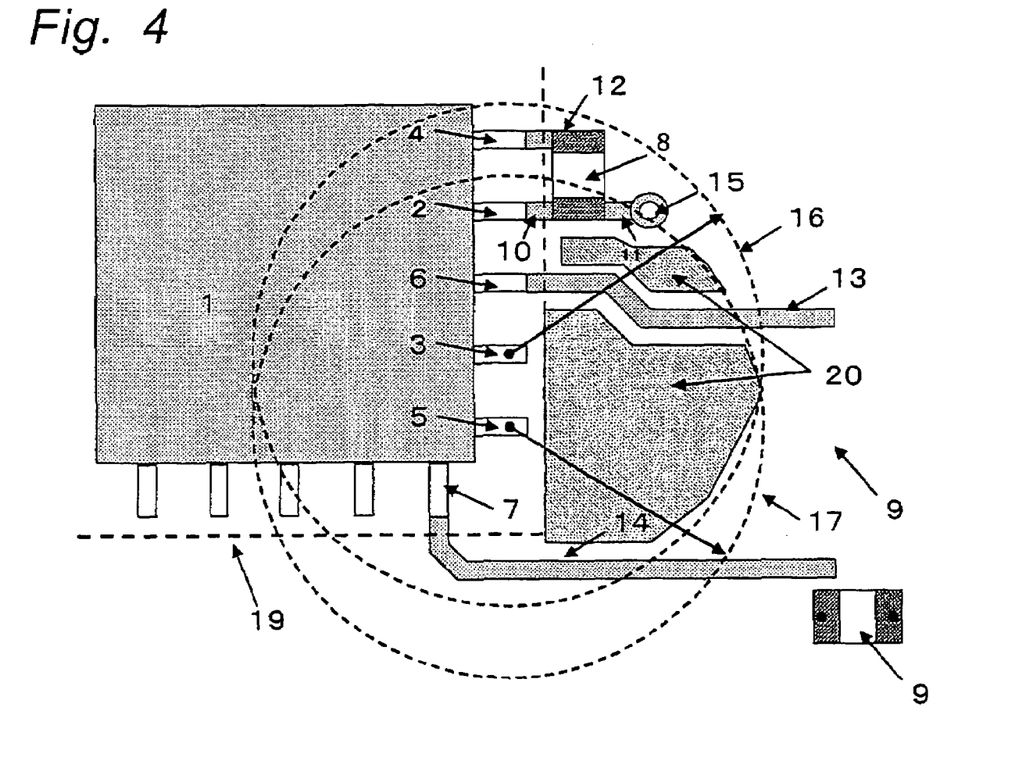
FIG. 4 is a top plan view (2) for describing a process for determining a placement region in the embodiment.

For example, in a case where restraints are placed on mounting or board fabrication of components shown in Table 2, a range 10 mm or less from the end of the IC indicated with a reference numeral 19 and a range 0.1 mm or less from a component terminal and an existing wire are excluded from a design rule based placement and wiring enable range that has been calculated in Step 6 to thereby calculate a mounting and design rule based placement and wiring enable range 20. In the above description, the term "restraints on mounting or board fabrication" is used, but it is needless to say that both restraints on mounting and board fabrication may be combined as those applied to the design.

TABLE 2 restraints on mounting and board fabrication

| | | Items | Restraints |
|---|---|---|---|
| 1 | Placement | Placement is prohibited | 10 mm or less from end of IC, |
| 2 | | | 0.1 mm from an end of a component |
| 3 | | Angle | 0 degree or 90 degree |
| 4 | Wiring | Distance | 0.1 mm or less from existing a wire is prohibited |

Step S8

Figure 5:
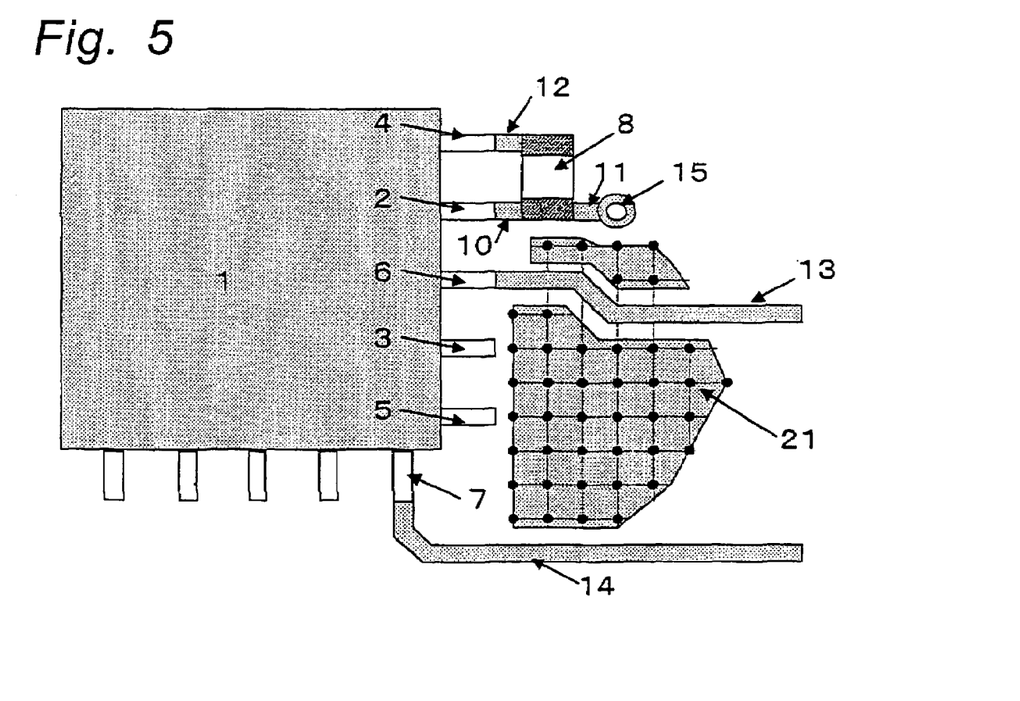
FIG. 5 is a top plan view (3) for describing a process for determining a placement region in the embodiment.

In step S8, for example, placement candidate points 21 are set in a lattice in the mounting and design rule based placement and wiring enable range 20 that has been calculated in step S7 (FIG. 5).

Spacing between adjacent placement candidate points 21 is determined giving consideration to the size, shape and others features of an EMC component to be placed.

Step S9

In step S9, the EMC component is temporarily placed so that the center of the component coincides with a placement candidate point that has been set in step S8 and thereafter, a candidate point is extracted so that the entire EMC component falls within the mounting and design rule based placement and wiring enable range 20 (narrowing candidate points down) and the EMC component is placed at one of the placement candidate points, which results in the candidate points being narrowed down.

Figure 6:
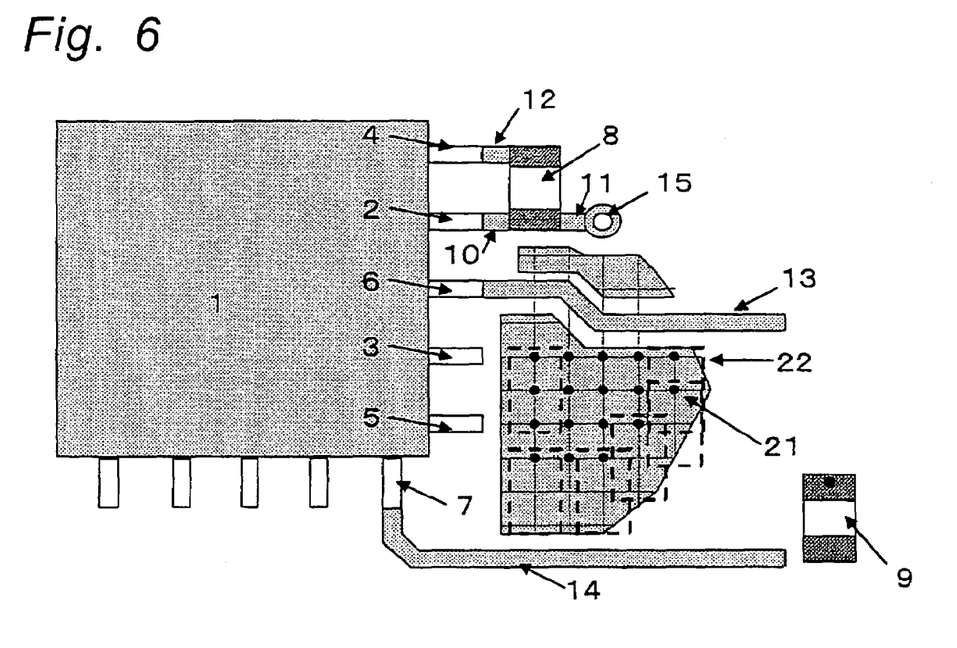
FIG. 6 is a top plan view (4) for describing a process for determining a placement region in the embodiment.
Figure 7:
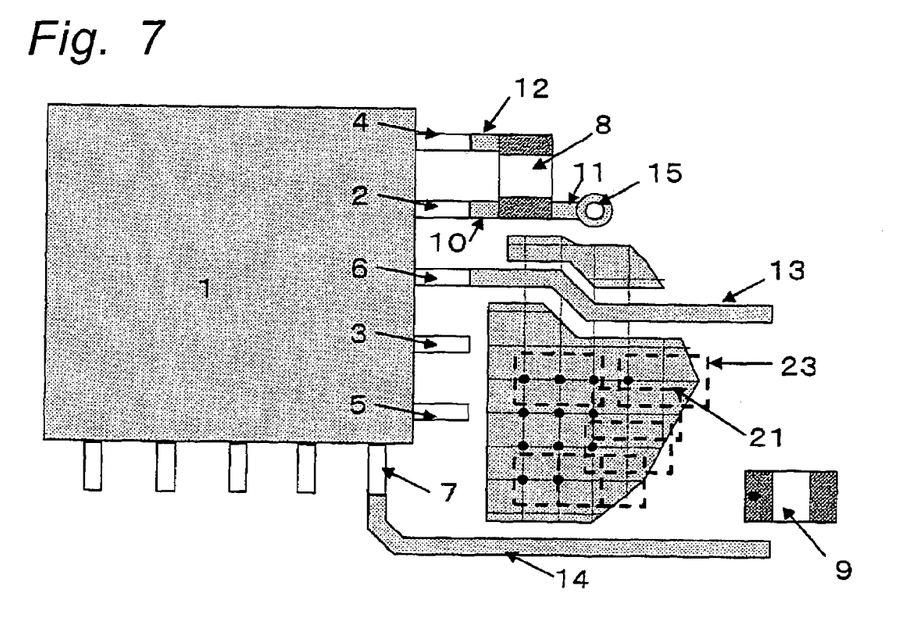
FIG. 7 is a top plan view (5) for describing a process for determining a placement region in the embodiment.

To be specific, it is determined, as shown in FIG. 6, whether or not the bypass capacitor placed at a candidate point 21 falls within the mounting and design rule based placement and wiring enable range 20 in each of the cases where a replacement angle is 0 degrees or 90 degrees, which are restraints of Table 2, and a candidate point, a bypass capacitor which falls outside the range 20 is excluded to thereby narrow candidate points down to the placement point 20 (FIGS. 6 and 7)

Note that in FIG. 6, reference numeral 22 indicates an example placement of the bypass capacitor 9 in a case where the placement angle is 90 degrees, while in FIG. 7, a reference numeral 23 indicates an example placement of the bypass capacitor 9 in a case where the placement angle is 0 degrees.

Step S10

In step S10, necessary wiring is provided to the EMC component that has been placed in step S9.

Step S11

In step S11, a placement margin of the EMC component that has been placed in step S9 and a wiring margin of wires that has been laid down in step S10 are calculated in each item of restraints on the design rule and the mounting.

The term "margin" means allowance of a restraint imposed on the design rule and mounting.

For example, in a case of a placement distance of the item 1 of Table 1, if a spacing between the IC power supply terminal and a capacitor is 16 mm, the margin in this case is 4 mm relative to the restraint of 20 mm or less and in a case of placement prohibited range of the item 1 of Table 2, if a distance from an end of IC to the EMC component is 15 mm, a margin in this case is 5 mm relative to the restraint of placement prohibition of 10 mm or less.

Step S12

An evaluation score of wiring and an evaluation score of placement are calculated based on weighted data calculated in each of the restraints on the design rule and mounting and a margin that has been calculated in step S11.

For example, an evaluation score of wiring (the sum total of evaluation scores of wires) is given as the sum total of evaluation scores of the items of the restraints on a design rule for wiring and mounting, and the evaluation score of wiring (the sum total of evaluation scores of wires) is given as the sum total of evaluation scores of the items of the restraints on the design rule for placement and mounting.

Step S13

In Step S13, it is determined whether or not evaluation is repeated while altering wiring (wiring pattern design) and if the process is terminated, it moves ahead to step S14, while if the process is not terminated, it returns to step S10, where a wiring pattern design is altered and a process from step S10 to step S13 is repeated.

For example, by repeating the process from step S10 to step S13, evaluation is conducted on all possible wiring patterns including temporarily placed lattice points, which enables selection of a wiring candidate to be completed.

Note that since, even in a case of a great number of the wiring candidates, the number is finite, and an evaluation can be done on all wiring candidates.

Step 14

In step S14, it is determined whether or not placement is altered and evaluation is repeated thereon, and if no placement is altered, the process advances to step S15, while if placement is altered and evaluation is repeated thereon, the process returns to step S9, where placement points are altered and a process from step S10 to step S14 is repeated.

In this process, for example, when evaluation is completed on all the lattice points, selection of a wiring candidate is completed.

Steps S15 and S16

In step S15, one candidate point is displayed among evaluated placement and wiring plans, and in step S16, in a case where the placement and wiring plan that has been displayed in step S15 is determined, a placement and wiring design for an EMC component is completed, or alternatively, in a case where a different candidate is selected, the process returns to step S15, where a different placement and wiring plan on which evaluation has been done is displayed, and in Step S16, the evaluated plan is confirmed.

For example, in steps S15 and S16, a placement and wiring plan with the highest evaluation scores as the first candidate is first displayed, it is determined whether or not the point is selected as the optimal and if the point is selected as the optimal placement and wiring design for an EMC component is completed.

If the optimal candidate point has a fault in selection because of the presence of items to which no consideration is given in the design rule and the like, which leads to a conclusion that the optimal candidate point is not decided, the process returns to step S15, where the second candidate point with the second highest evaluation point is displayed, and in step S16, it is confirmed whether or not the second candidate is the optimal.

Besides, if the second candidate point still has a fault, a process of steps S15 and S16 is repeated.

By repeating the process of steps S15 and S16, the optimal candidate point is selected as a final one.

Figure 8:
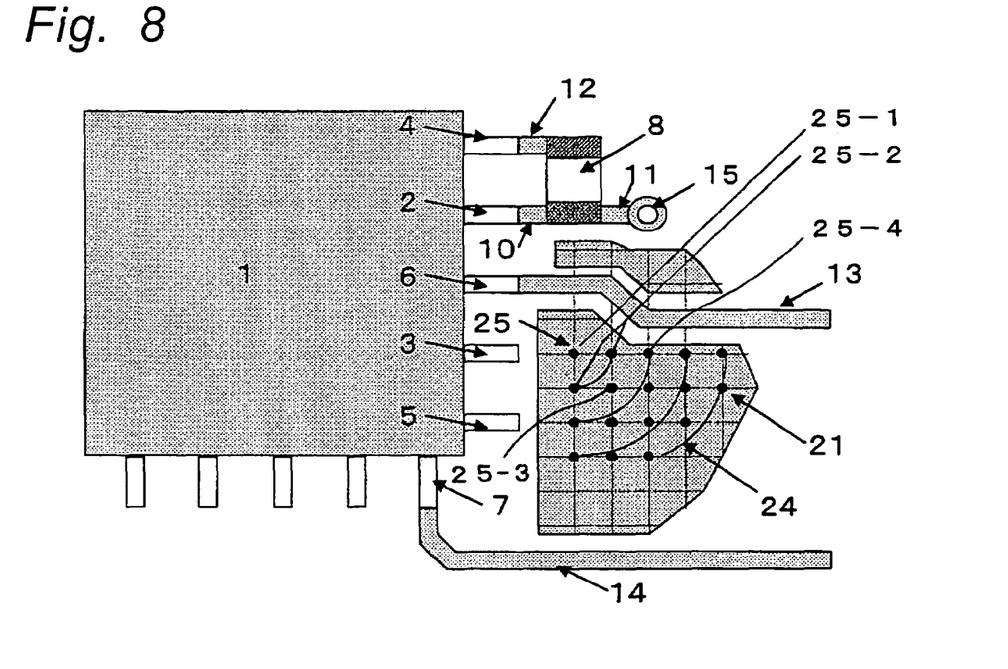
FIG. 8 is a top plan view (placement angle is 90 degrees) showing an example display of the optimal placement position in the embodiment.

Note that in step S15, for example, the candidate points may be, as shown in FIG. 8, displayed as contour lines based on evaluation scores of the candidate points. In the example shown in FIG. 8, contour lines are shown in such a way that the first candidate point 25-1 with the highest evaluation score is selected as the center, the two second candidate points 25-2 with the second highest evaluation score are connected with a contour line, and the two fourth candidate points 25-4 with the fourth highest evaluation score are connected with a contour line, . . . contour lines with evaluation scores lower than the fourth evaluation score are sequentially drawn. Note that the third candidate points are located between the contour line drawn between the second candidate points 25-2 and the contour line drawn between the fourth candidate points 25-4.

Figure 9:
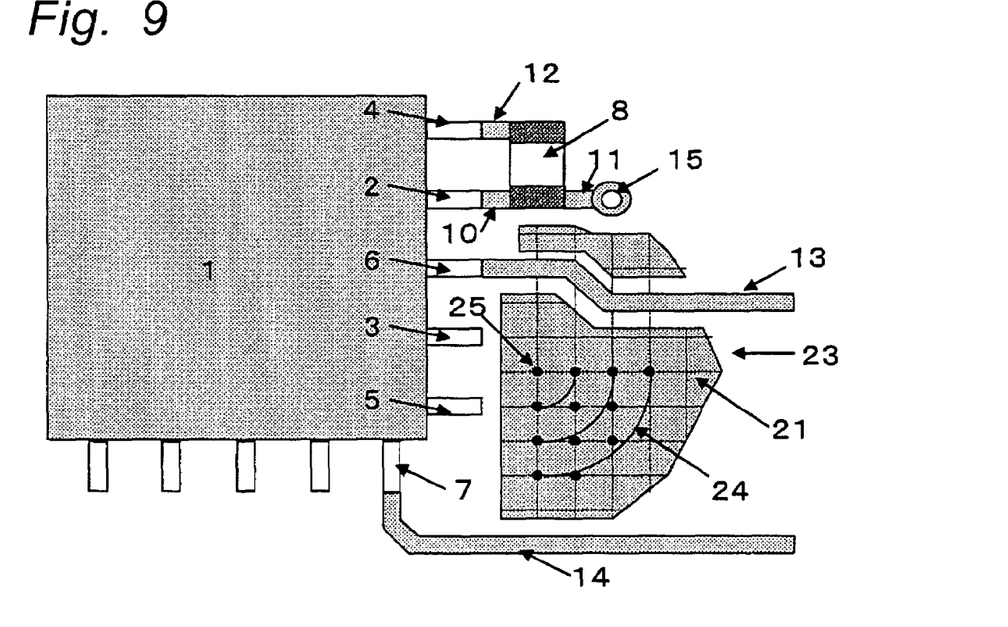
FIG. 9 is a top plan view (placement angle is 0 degrees) showing an example display of the optimal placement position in the embodiment.

Contour lines in a case of a placement angle of 0 degree are shown as in FIG. 9, which is similar to those in the case of a placement angle of 90 degrees shown in FIG. 8.

In the invention, candidate points may be displayed as a contour diagram in which they are classified by color according to evaluation scores instead of contour lines.

In the invention, as described above, an optimal evaluation score distribution can be displayed as contour lines or a contour diagram based on the evaluation points at the respective lattice points.

Positions and a range with good integrated scores shown in the contour lines or the contour diagram can be displayed, for example, as recommended positions for an EMC component such as a bypass capacitor as far as no specific restraint exists (for example, no specific restraint item is inputted), thereby enabling automation of designation of the optimal point to be effected.

An evaluation score of each of the items calculated based on a margin or the like can be held as information for design check for an EMC component or can also be used so as to be reflected in updating of an EMC design rule or updating of weight data for EMC components of the same kind.

In the invention, as described above, it is possible to decide the optimal placement and wiring position in a placement and wiring enable region satisfying an EMC design rule for an EMC component such as a bypass capacitor and restraint items on board fabrication, thereby enabling EMC design of a stable printed wiring board having a design quality without depending on a designer to be realized.

Detailed description will be given of margin and weighted data below.

In the embodiment, for example, weights are individually determined and obtained as data for respective restraint items of component placement and wiring in an EMC reduction design rule, as shown in Table 2, based on whether or not there was a record of causing an EMC problem associated with the items in the past such as a signal frequency and a current value of IC connected, and on whether or not a board design is easy.

Note that, in Table 3, the presence or absence of an EMC problem in the past means a case where a problem related to EMC occurred in a circuit using the same IC or a similar IC in the past.

As to the ease of application, a higher weight is assigned in a case where an EMC component was applied to an IC of the same kind in the past.

TABLE 3

| Signal frequency of IC | Current value | The presence or absence of past EMC problem | Easiness of application | Weight |
| --- | --- | --- | --- | --- |
| Less than 10 MHz, | In smaller case, signal less than 20 mA and power supply is less than 1 A | No | Not easy | 1 |
| | | | Easy | 1 |
| | | Yes | Not easy | 3 |
| | | | Easy | 4 |
| | In larger case, signal is 20 mA or more and power supply is 1 A or more | No | Not easy | 1 |
| | | | Easy | 2 |
| | | Yes | Not easy | 3 |
| | | | Easy | 4 |
| 10 MHz or more | In smaller case, signal less than 20 mA and power supply is less than 1 A | No | Not easy | 1 |
| | | | Easy | 2 |
| | | Yes | Not easy | 3 |
| | | | Easy | 4 |
| | In larger case, signal is 20 mA or more and power supply is 1 A or more | No | Not easy | 2 |
| | | | Easy | 3 |
| | | Yes | Not easy | 4 |
| | | | Easy | 5 |

Figure 10:
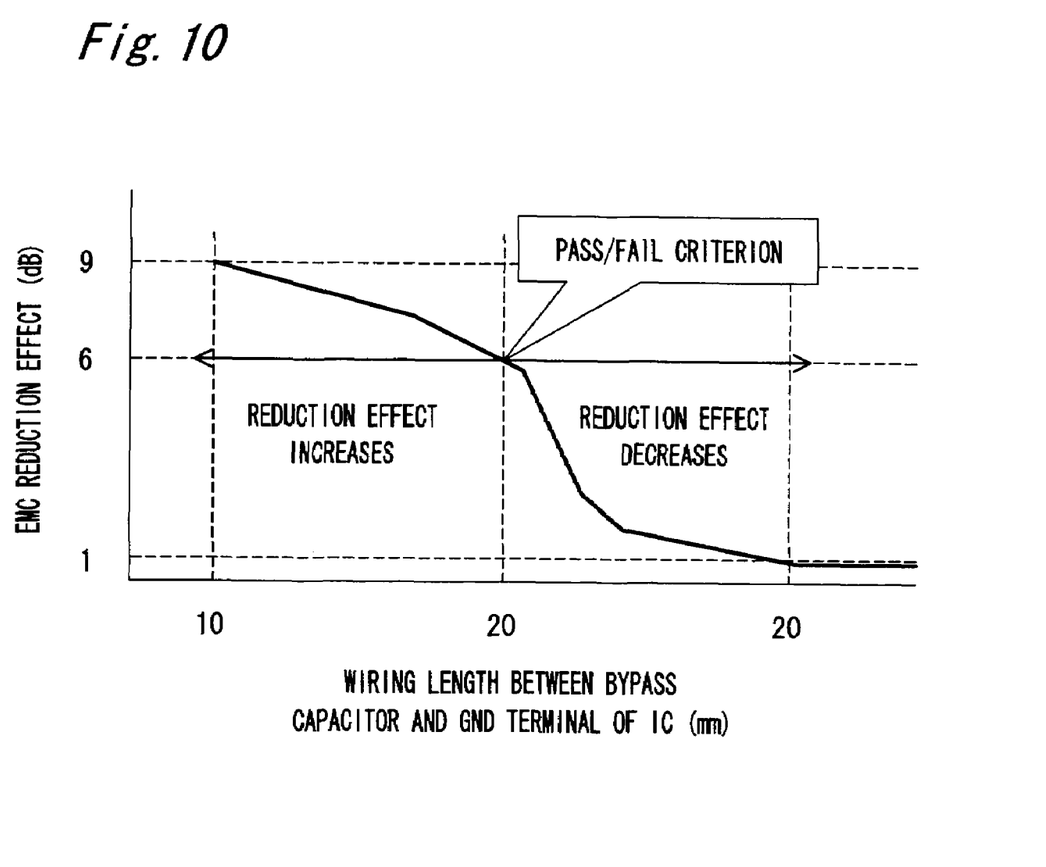
FIG. 10 is a graph showing an example effect of a length between a bypass capacitor and a GND terminal of an IC on EMC reduction in the embodiment.

A pass/fail criterion which serves as a condition in an EMC design rule is decided by grasping an EMI attenuation (or increase) at a position apart by, for example, 3 m or 10 m by theoretical calculation or an experiment, and an EMC reduction effect varies, for example, as shown in FIG. 10.

In a case where, as shown in FIG. 10, as a design value is reduced to a value lower than a pass/fail criterion, an effect of EMC reduction is higher, a margin is given by the difference between the design value and the pass/fail criterion (the pass/fail criterion—the design value).

In a case where, as a design value is increased to a value higher than a pass/fail criterion, an effect of EMC reduction shows a tendency to increase contrary to FIG. 10, a margin is given by the difference between the design value and the pass/fail criterion (the design value—the pass/fail criterion).

(Evaluation Score)

Evaluation score of each of the items is obtained by the following equation (1) based on a weight and a margin obtained as described above.

Evaluation Score=Basic Score(for example,10 points)×(1+Margin/Criterion)×Weight      Equation (1)

wherein it is needless to say that the basic points are not limited to 10 points and has only to be set so as to obtain a proper figure as each evaluation score and an integrated evaluation score that is easy to be evaluated when evaluation is performed.

In the embodiment having been described above, a placement and wiring enable range for a bypass capacitor has been conventionally determined by a person at random within a range in which a design rule is observed and can be automatically displayed based on a design rule.

Besides, it can be determined whether or not placement and wiring candidate positions in a lattice in a placement and wiring enable range satisfies a design rule, and the optimal position can also be determined by calculating an optimality evaluation score weighted in each of restraint items as shown in the flow chart of FIG. 1.

According to the invention, the most excellent placement and wiring position in the placement, wiring enable range is displayed as a recommended design plan to thereby not only enable automation of placement and wiring design for an EMC component such as a bypass capacitor to be realized, but also to enable application to placement and wiring design for components other than an EMC component to be ensured.

The invention claimed is:

1. A printed wiring board design method comprising:
    designing placement and wiring for circuit components based on circuit information on a mounting surface of a board;
    excluding a placement region and a wiring region for the circuit components from the mounting surface to calculate a placement and wiring enable region for EMC components in which the EMC components can be placed and wiring;
    calculating placement and wiring ranges for the EMC components based on the calculated placement and wiring enable region and an EMC design rule; and
    evaluating placement and wiring of the EMC components in the placement and wiring ranges as compared to the EMC design rule, wherein said evaluating is based on allowances of design values of items of the EMC design rule and weights assigned to the items.

2. The printed wiring board design method according to claim 1,
    wherein the placement and wiring range for the EMC components is calculated based on the EMC design rule and restraints on mounting and/or board fabrication.

3. The printed wiring board design method according to claim 1, wherein one of the circuit components is an IC and one of the EMC components is an EMC component for the IC, wherein said EMC design rule includes a rule based on a distance from a terminal of the IC to the EMC component for the IC.

4. The printed wiring board design method according to claim 1, further comprising, forming orderly arranged lattice points, temporarily placing and wiring the EMC components at the lattice points, and then said evaluation is conducted, and evaluation scores are calculated based on the placements and wirings at said lattice points.

5. The program for executing, on a computer, a printed wiring board design method as claimed in claim 1.

6. The record medium comprising the program according to claim 5.

7. The printed wiring board design method according to claim 1, wherein said EMC design rule includes a plurality of items and overlapping regions of the placement and wiring ranges, which are decided so as to correspond to the items, respectively, are calculated as the placement and wiring enable regions for the EMC component.

8. The printed wiring board design method according to claim 7, wherein one of the items is related to a distance in a straight line between the terminal of the IC and the EMC component for the IC, and another one of the items is related to a wiring length between the terminal of the IC and the EMC component for the IC.

9. A program stored on a computer readable medium for executing, on a computer, a printed wiring board design method according to claim 1.

10. A printed wiring board design method comprising:
    designing placement and wiring for circuit components based on circuit information on a mounting surface of a board;
    excluding a placement region and a wiring region for the circuit components from the mounting surface to calculate a placement and wiring enable region for EMC components in which the EMC components can be placed and wiring; and
    calculating placement and wiring ranges for the EMC components based on the calculated placement and wiring enable region and an EMC design rule,
    wherein said EMC design rule includes a plurality of items, and overlapping regions of the placement and wiring ranges, which are determined so as to correspond to the items, are calculated as the placement and wiring enable regions for the EMC components,
    wherein one of the items is related to a distance in a straight line between a terminal of an IC and the EMC component for the IC, and another one of the items is related to a wiring length between the terminal of the IC and the EMC component for the IC, and
    wherein the terminal of the IC is a power supply terminal, said board has a via hole for connecting the power supply terminal, and said EMC design rule includes an item related to a wiring length from the via hole to the EMC component for the IC, and an item related to a ratio of said wiring length to a wiring length from the via hole to the power supply terminal.

11. The printed wiring board design method according to claim 10, wherein the placement and wiring range for the EMC components is calculated based on the EMC design rule and restraints on mounting and/or board fabrication.

12. The printed wiring board design method according to claim 10, wherein one of the circuit components is an IC and one of the EMC components is an EMC component for the IC, and said EMC design rule includes a rule based on a distance from a terminal of the IC to the EMC component for the IC.

13. A printed wiring board design device comprising: means in which placement and wiring regions for circuit components are excluded from a mounting surface, where placement of and wiring for circuit components is designed, to calculate a placement and wiring enable region for EMC components in which the EMC components can be placed and wired, and placement and wiring ranges for the EMC components are calculated based on the calculated placement and wiring enable region and an EMC design rule, and said placement and wiring range is displayed, wherein said placement and wiring ranges for the EMC components are set as ranges where a designer is allowed to designate other ranges that restrict the placement and wiring of the EMC components.

14. A CAD system comprising a printed wiring board design device according to claim 13.

15. A printed wiring board design device comprising means in which placement and wiring regions for circuit components are excluded from a mounting surface, where placement of and wiring for circuit components is designed, to calculate a placement and wiring enable region for EMC components in which the EMC components can be placed and wired, and placement and wiring ranges for the EMC components are calculated based on the calculated placement and wiring enable region and an EMC design rule, and said placement and wiring range is displayed, wherein placement and wiring of the EMC components in the placement and wiring ranges is evaluated as compared to the EMC design rule, and said evaluation is conducted based on allowances of design values of items of the EMC design rule and weights assigned to the items.

16. The printed wiring board design device according to claim 15 in which orderly arranged lattice points are formed, the EMC components are placed at the lattice points, respectively, and are wired and then said evaluation is conducted, and relative merits of effects on the EMC components at the lattice points are evaluated.

17. The printed wiring board design device according to claim 16, wherein effects of EMC in the placement and wiring range are displayed as contour lines or a contour diagram based on evaluation scores and locations of the lattice points.

18. The printed wiring board design device according to claim 16, wherein the evaluation of each lattice point is obtained based on allowances of design values of each item of the EMC design rule and a weight set to each item.

19. A CAD system comprising a printed wiring board design device according to claim 15.

* * * * *